(12) United States Patent
Ladurner et al.

(10) Patent No.: US 10,473,711 B2
(45) Date of Patent: Nov. 12, 2019

(54) MULTI-CHANNEL FAULT DETECTION WITH A SINGLE DIAGNOSIS OUTPUT

(71) Applicant: Infineon Technologies AG, Neubiberg (DE)

(72) Inventors: Markus Ladurner, Villach (AT); Albino Pidutti, Villach (AT); Daniel Mayer, Ranten (AT)

(73) Assignee: Infineon Technologies AG, Neubiberg (DE)

( * ) Notice: Subject to any disclaimer, the term of this patent is extended or adjusted under 35 U.S.C. 154(b) by 663 days.

(21) Appl. No.: 15/130,775

(22) Filed: Apr. 15, 2016

(65) Prior Publication Data

US 2017/0302071 A1  Oct. 19, 2017

(51) Int. Cl.
*G01R 31/28* (2006.01)
*G01R 31/317* (2006.01)
*G01R 31/02* (2006.01)
*G06F 11/00* (2006.01)
*H04Q 1/00* (2006.01)
(Continued)

(52) U.S. Cl.
CPC ........ *G01R 31/2856* (2013.01); *G01R 31/025* (2013.01); *G01R 31/31715* (2013.01); *G06F 11/00* (2013.01); *H04Q 1/00* (2013.01); *H02H 3/17* (2013.01); *H02H 7/26* (2013.01)

(58) Field of Classification Search
CPC ............ G01R 31/2851; G01R 31/2856; G01R 31/2884; G01R 31/31724; G01R 31/00–44; G06F 11/27; G06F 11/00–3696; H01L 22/30; G05B 23/02
See application file for complete search history.

(56) References Cited

U.S. PATENT DOCUMENTS 4,183,460 A * 1/1980 Yuen ................. G01R 31/3004
                                                    714/732
4,504,784 A * 3/1985 Goel ................ G01R 31/31855
                                                    714/726
(Continued)

FOREIGN PATENT DOCUMENTS

CN     102566564 A     7/2012
CN     105388881 A     3/2016
(Continued)

OTHER PUBLICATIONS

"PROFET™ + 24V BTT6100-2EKA, Smart High-Side Switch Dual Channel, 100mΩ," Infineon, Automotive Power Data Sheet, Rev. 1.0, Aug. 20, 2014, 48 pp.
(Continued)

*Primary Examiner* — Ronald W Leja
*Assistant Examiner* — Christopher J Clark
(74) *Attorney, Agent, or Firm* — Shumaker & Sieffert, P.A.

(57) ABSTRACT

A multi-channel device with a single diagnosis status pin may be configured to detect if one or more channels has a fault. The multi-channel device, which may operate within a system, can communicate which channel, of a plurality of channels, has the fault using only a single diagnosis status pin and no additional diagnosis control pins. The multi-channel device may output a fault signal on the diagnosis status pin and in response to an interrogation input signal on the same channel as a fault channel indicate to the system which channel is the fault channel.

20 Claims, 7 Drawing Sheets

(51) Int. Cl.
  *H02H 7/26* (2006.01)
  *H02H 3/17* (2006.01)

(56) References Cited

U.S. PATENT DOCUMENTS

| | | | | |
|---|---|---|---|---|
| 6,260,163 | B1* | 7/2001 | Lacroix | G01R 31/31905 714/726 |
| 6,459,290 | B1* | 10/2002 | Nishikawa | G01R 31/2856 324/537 |
| 6,934,884 | B1* | 8/2005 | Wakabayashi | G01R 31/318335 714/30 |
| 2006/0195682 | A1* | 8/2006 | Robert | G06F 11/3656 712/227 |
| 2008/0141089 | A1* | 6/2008 | Maeda | G01R 31/31713 714/733 |
| 2009/0235131 | A1* | 9/2009 | Kemmerling | G06F 11/273 714/723 |
| 2012/0121109 | A1* | 5/2012 | Chang | H03M 1/14 381/120 |
| 2014/0197409 | A1* | 7/2014 | Partsch | H01L 25/18 257/48 |
| 2016/0349320 | A1* | 12/2016 | Laisne | G01R 31/3177 |
| 2016/0377677 | A1* | 12/2016 | Tille | G06F 11/267 714/727 |
| 2017/0067848 | A1* | 3/2017 | Chandrasekhar | G01N 27/4163 |
| 2017/0108533 | A1* | 4/2017 | Ohmart | G01R 1/0441 |
| 2017/0227604 | A1* | 8/2017 | Whetsel | G01R 31/3177 |
| 2017/0234926 | A1* | 8/2017 | Murthy | G01R 31/3177 714/729 |

FOREIGN PATENT DOCUMENTS

| | | |
|---|---|---|
| CN | 105425766 A | 3/2016 |
| WO | 2006053587 A1 | 5/2006 |
| WO | 2010106403 A1 | 9/2010 |

OTHER PUBLICATIONS

"Overview and Use of the PICmicro Serial Peripheral Interface," SPI™, Microchip, Jan. 21, 2002, 46 pp.

Office Action, in the Chinese language, from counterpart Chinese Application No. 201710243327.5, dated Jan. 9, 2019, 8 pp.

* cited by examiner

MULTI-CHANNEL FAULT DETECTION WITH A SINGLE DIAGNOSIS OUTPUT

TECHNICAL FIELD

The disclosure relates to fault detection in electronic devices.

BACKGROUND

Many integrated modules, including integrated circuits, use several pins to implement diagnosis functionality. Some multi-channel products may have a diagnosis status for each channel. In some cases, package size may limit the number of available pins. These products may use fewer diagnosis status pins, with the drawback that it may only be possible to detect that there is a fault somewhere in the device, but not which channel has the fault. Still other products may implement a diagnosis multiplexor approach or serial peripheral interface (SPI). The multiplexor, SPI and similar approaches may limit monitoring capabilities as well as increase circuit complexity and possibly increase the required number of pins to the circuit for a given application.

SUMMARY

In one example, the disclosure is directed to a system comprising a multi-channel device including: a diagnosis status pin; a plurality of channels; a plurality of input pins, wherein each channel of the plurality of channels has an associated input pin; a plurality of output pins, wherein each channel of the plurality of channels has an associated output pin; and a processor coupled to the diagnosis status pin and configured to determine which channel of the plurality of channels is a fault channel using the diagnosis status pin.

In another example, the disclosure is directed to a multi-channel device comprising: a diagnosis status pin; a plurality of channels; a plurality of input pins, wherein each channel of the plurality of channels has an associated input pin; a plurality of output pins, wherein each channel of the plurality of channels has an associated output pin; and the multi-channel device configured to: detect a fault on at least one channel of the plurality of channels; and output which channel is a fault channel using the diagnosis status pin.

In another example, the disclosure is directed to a method comprising monitoring, by a multi-channel device, each channel of a plurality of channels in the multi-channel device; detecting, by the multi-channel device, a fault in at least one channel of the multi-channel device; and in response to detecting a fault on the at least one channel: determining at least one channel is a fault channel; and outputting which channel is the fault channel using the diagnosis status pin.

The details of one or more embodiments of the disclosure are set forth in the accompanying drawings and the description below. Other features, objects, and advantages of the disclosure will be apparent from the description and drawings, and from the claims.

DETAILED DESCRIPTION

Techniques of this disclosure may enable a multi-channel device to identify a faulty channel using only one diagnosis status pin on the device and no additional diagnosis control pins. If a channel in a multi-channel device has a fault, a system using the multi-channel device may need to identify which channel has the fault. A multi-channel device configured in accordance with the techniques of this disclosure may detect which channel is the fault channel and communicate this information to the system by using only a single pin. For example, a system using a multi-channel device may be capable of determining which channel, of a number of channels, may have a fault. The system may use simple control techniques with a single diagnosis connection per device to diagnose the status of each channel of the device. The single diagnosis status connection may also mean a smaller size and less complicated connection scheme.

The multi-channel device may be part of a system and may detect a fault on one or more channels. The device may alert the system by outputting a fault signal on the diagnosis status pin. At this point, the system knows that at least one channel has a fault, but the system does not know which channel had the fault. In one example, a processor, such as microcontroller or similar device, may send a sequence of interrogation input signals to each channel input of the multi-channel device in response to the alert. The processor may send each interrogation input signal to one channel at a time and monitor the diagnosis status pin while sending the interrogation input signals. In response to the interrogation input signal, the diagnosis status pin may indicate to the processor whether the interrogation input signal is on the fault channel. For example, the diagnosis status pin may temporarily cease the fault signal when the processor sends the interrogation input signal on the fault channel. In this way, the processor receives an indication that the processor is interrogating a fault channel. In other examples, when the processor sends the interrogation input signal on the fault channel the diagnosis status pin may start the fault signal, or send a completely different signal. Any such technique may indicate to the processor which channel, or channels, have a fault by using only the respective channel input pin associated with a respective channel and a single diagnosis status pin. This may avoid the need to use a separate diagnosis multiplexor or channel selection pins nor a complex communication scheme.

Figure 1:
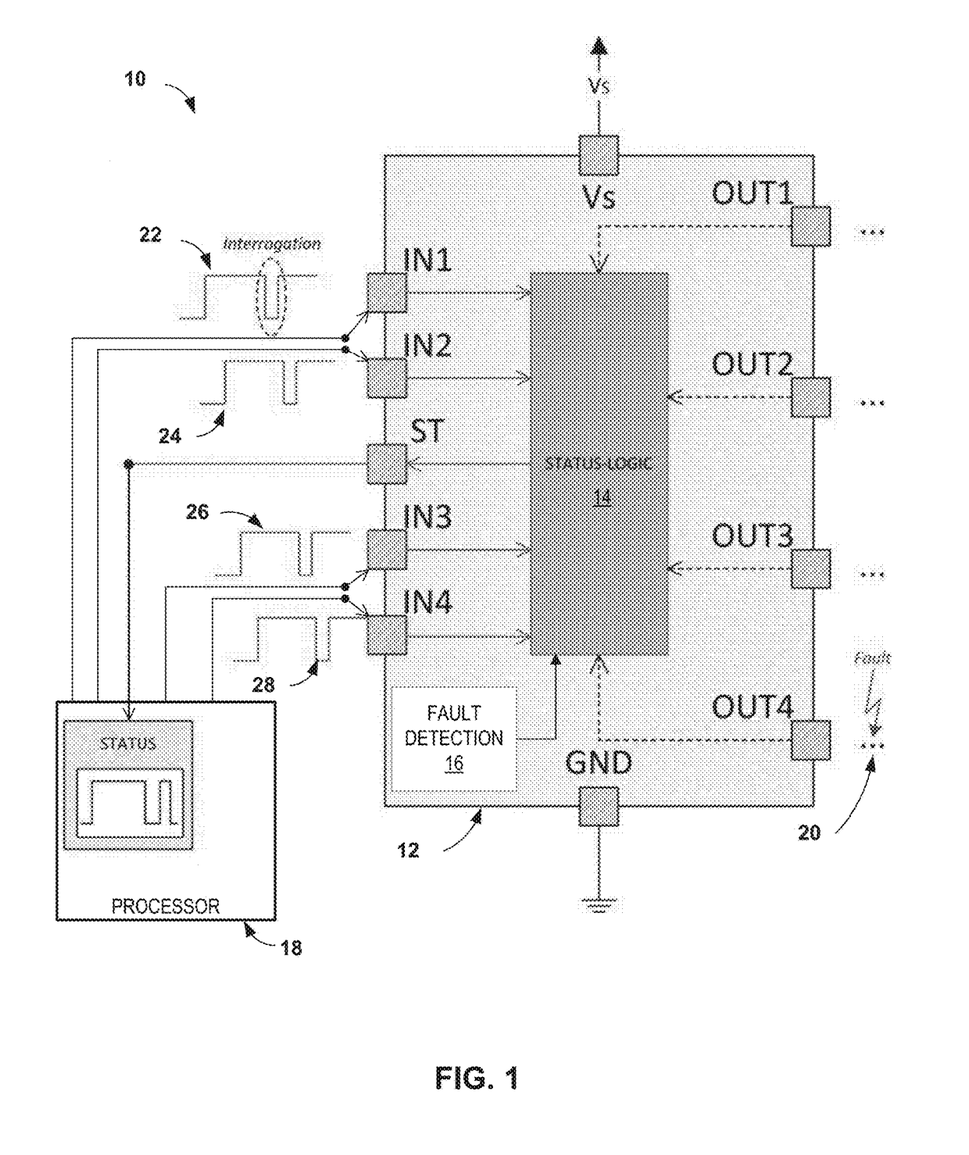
FIG. 1 is a conceptual block diagram illustrating an example system that includes a multi-channel device with a single diagnosis status pin, in accordance with one or more techniques of this disclosure.

FIG. 1 is a conceptual block diagram illustrating an example system that includes a multi-channel device with a single diagnosis status pin, in accordance with one or more techniques of this disclosure. System 10 includes a multi-channel device 12, that may also include a status logic module 14, fault detection module 16, a diagnosis status pin ST, and a processor 18 that may monitor of diagnosis status pin ST. FIG. 1 depicts multi-channel device 12 with four channels, each channel with an input (IN1-IN4) and an output (OUT1-OUT2). However, in other examples, multi-channel device 12 may have more than four or fewer than four channels. Processor 18 may connect to each channel input pin (IN1-IN4) and transmit interrogation input signals (22-28) in response to a fault 20 on one of the channels. Examples of processor 18 may include any one or more of a microprocessor, a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry.

Multi-channel device 12, as depicted in FIG. 1, includes four channels each with an input connected through various components to a respective output associated with a respective channel. This disclosure, however, is not limited to four channel devices, and may be used with multi-channel devices having any number of channels. In the example of FIG. 1, input pin IN1 and output pin OUT1 may be associated with channel one (CH1). The example of FIG. 3, discussed below, provides some example details of the connections between input and output. Multi-channel device 12 of FIG. 1 may be grounded through the GND pin and receive power through the Vs pin. Fault detection module 16 may monitor the channels of multi-channel device 12 during operation. Should fault detection module 16 detect a fault 20 on one of the channels, fault detection module 16 may send a channel fault signal to status logic module 14. For example, as shown in FIG. 1, if channel 4 gets a fault 20, fault detection module 16 may send a channel fault signal to status logic module 14 for channel 4. The channel fault signal will be particular to a particular channel. The example of FIG. 2 will describe status logic module 14 in more detail.

Figure 2:
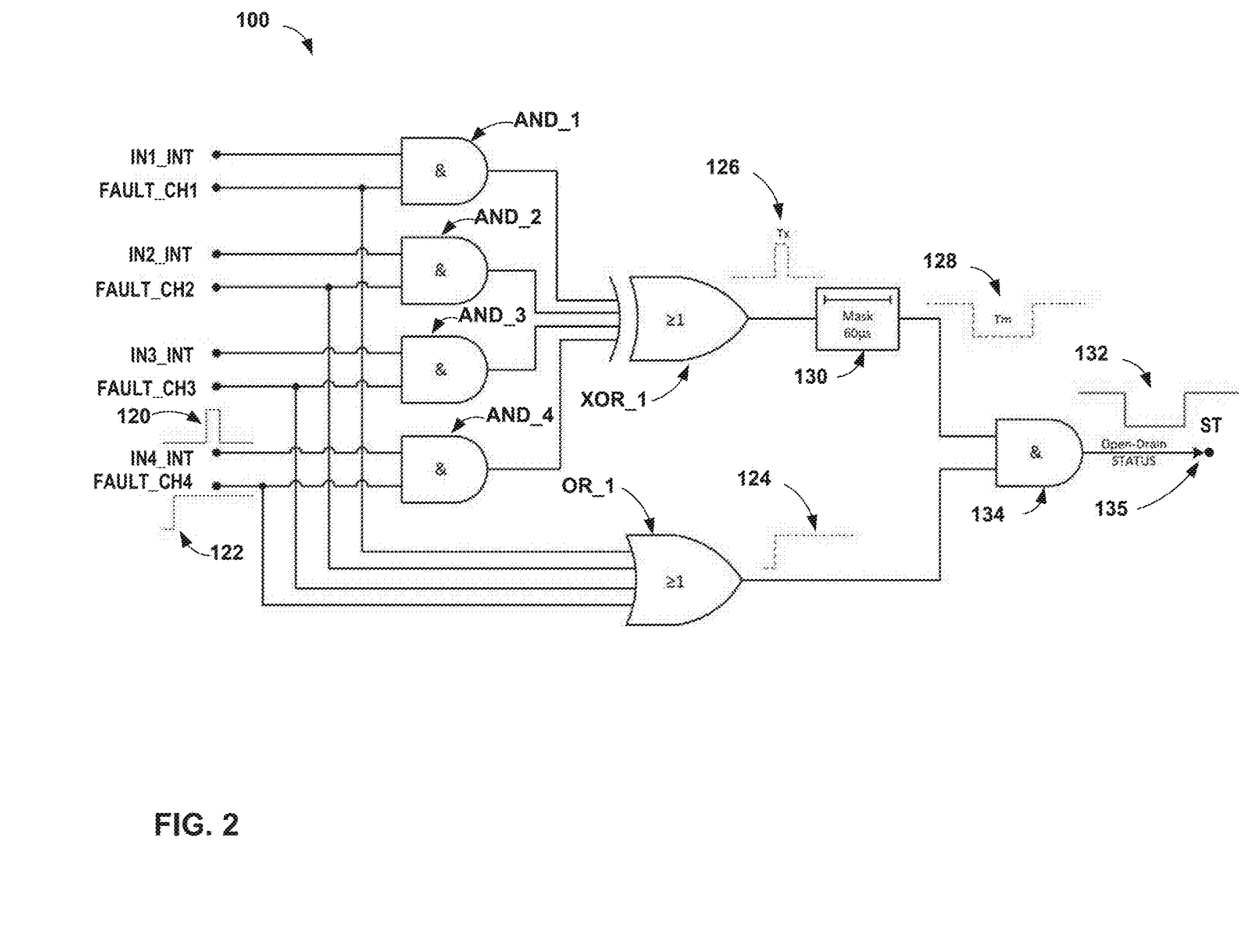
FIG. 2 is a conceptual and schematic block diagram illustrating an example technique to implement a status logic module, in accordance with one or more techniques of this disclosure.

Status logic module 14 may receive the channel fault signal from fault detection module 16 and in response may output a fault signal on diagnosis status pin ST. Processor 18 may connect to diagnosis status pin ST and be configured to determine which channel of multi-channel device 12 is a fault channel. Processor 18 may use diagnosis status pin ST to provide processor 18 the status (ST=Status) of each channel of multi-channel device 12. In response to processor 18 receiving a fault signal from diagnosis status pin ST, processor 18 may begin an interrogation sequence. The interrogation sequence begins by transmitting an interrogation input signal 22 on a first channel, IN1. In the example of FIG. 1, processor 18 transmits interrogation input signals to each channel, one at a time in sequence, beginning with channel one, IN1. In other examples, processor 18 may transmit interrogation input signals (22-28) in a different sequence, such as the odd channels, one at a time, followed by the even channels.

Processor 18 continues to monitor diagnosis status pin ST during the interrogation input signal sequence. Status logic module 14 may also monitor each input pin (IN1-IN2). If the interrogation input signal is on a different channel than the fault channel, the status logic module 14 may continue to output the fault signal on diagnosis status pin ST. If the interrogation input signal is on the same channel as the fault channel, status logic module 14 may temporarily cease outputting the fault signal for a delay time. After a delay time, status logic module 14 may begin transmitting the fault signal again. Processor 18 may use this pause in the fault signal corresponding to the interrogation input signal on the fault channel to determine which channel is the fault channel.

In one example, as shown in FIG. 1, channel four may identify a fault 20. Fault detection module 16 may determine that there is a fault on channel 4 and transmit a channel fault signal to status logic module 14. In response to the channel fault signal from fault detection module 16, status logic module 14 may output a fault signal on diagnosis status pin ST. In response to detecting the fault signal on diagnosis status pin ST, processor 18 may begin transmitting interrogation input signal 22 to IN1 and continue to monitor diagnosis status pin ST. Because IN1 is not part of the fault channel, status logic module 14 may continue to output the fault signal on diagnosis status pin ST.

In response to receiving an indication of a fault on diagnosis status pin ST, processor 18 may transmit interrogation input signal 24 to IN2. As with IN1, because channel two (CH2) is not the fault channel, status logic module 14 may continue to transmit a fault signal on diagnosis status pin ST. Processor 18 may continue the interrogation sequence on CH3 and then on CH4. When processor 18 transmits interrogation input signal 28 to IN4, status logic module 14 may cease outputting the fault signal on diagnosis status pin ST for a delay time. Processor 18 may detect that the fault signal on diagnosis status pin ST ceased when processor 18 transmitted interrogation input signal 28. This may indicate to processor 18 that channel 4 is the fault channel.

Note that in the example of FIG. 1 and FIG. 2, processor 18 detects that the fault signal on diagnosis status pin ST ceased when processor 18 transmitted the interrogation input signal to the fault channel, IN4. In other examples, however, status logic module 14 may instead be configured to cease the fault signal when processor 18 transmits the interrogation sequence to a non-fault channel. In still other examples, status logic module 14 may transmit a different signal on diagnosis status pin ST when processor 18 transmits an interrogation input signal on the fault channel. In this way, multi-channel device 12 may communicate to processor 18 through a single diagnosis status pin ST to identify which channel of multi-channel device 12 has the fault. This may provide several advantages to system 10 including fewer pins on multi-channel device 12. A multi-channel device with this configuration uses only the ST pin and the channel input pins (IN1-IN4), so requires no additional input pins. This may reduce size, cost and complexity of system 10. A multi-channel device configured according to the techniques of this disclosure may provide full diagnosis functionality with a low complexity diagnosis interface allowing greater flexibility in a larger number of applications.

In the example of FIG. 1, a processor 18 is external to multi-channel device 12 and transmitted the sequence of interrogation input signals to multi-channel device 12. However, in other examples, processor 18 and multi-channel device 12 may be integrated into a single package. A single diagnosis status pin on multi-channel device 12, or other examples of the low complexity diagnostic scheme of this disclosure may allow greater flexibility to use multi-channel device 12 in a variety of systems. Some specific examples may include automotive applications, such as solenoid control and monitoring, light or LED controllers and engine control systems. Other examples may include aircraft data monitoring, controls and sensors, such as a wheel position sensor or flight control position sensor. Still other examples may include other systems such as a refining centrifuge, heating, ventilation and air conditioning (HVAC), power plant monitoring and control, and other machinery.

FIG. 2 is a conceptual and schematic block diagram illustrating an example technique to implement a status logic module, in accordance with one or more techniques of this disclosure. Status logic module 100 corresponds to status logic module 14 of FIG. 1. The example of FIG. 2 depicts status logic module 100 as connected discrete logic elements. However, status logic module 100 may be implemented by software, firmware or hardware, including an FPGA, microprocessor, or other similar technique. The example of FIG. 2 depicts status logic module 100 with two inputs for each channel. First, each channel may have an input (IN1_INT-IN4_INT) that monitors the interrogation input signal 120. Second each channel may have an input for the channel fault signal (FAULT_CH1-FAULT_CH4), such as channel fault signal 122. As with FIG. 1 above, the example of FIG. 2 depicts a four-channel status logic module, however, status logic module 100 may have any number of channels that correspond to the multi-channel device.

The two inputs for each channel, INx_INT and FAULT_CHx, connect to a respective AND gate for each channel (AND_1-AND_4). The outputs of each of the channel AND gates (AND_1-AND_4) may connect to the input of XOR_1. The output of XOR_1 (126) may connect to delay module 130. The output of delay module 130 (128) may connect to the output AND gate (134). The channel fault signal inputs (FAULT_CH1-FAULT_CH4), in addition to connecting to the channel AND gates may also connect to the input of OR_1. The output of OR_1 may connect to the output AND gate, 134. Finally, the output of 134 may connect to status diagnosis pin ST (135).

In operation, status module 100 allows channel specific fault detection within multi-channel devices. Continuing the example of FIG. 1, FIG. 2 depicts channel 4 with a fault. Fault detection module 16 (from FIG. 1), or some other mechanism, may detect the fault on channel 4 and send fault signal 122 to FAULT_CH4. Because FAULT_CH4 may be an input to OR_1, then OR_1 receives fault signal 122 and may send fault signal 122 as combined fault signal 124 to output AND gate 134. The output of delay module 130 is normally HIGH (128), therefore output AND gate 134 may pass combined fault signal 124 to diagnosis status pin 135. As noted in the example of FIG. 1, diagnosis status pin 135 may connect to processor 18 (not shown in FIG. 2).

In response to detecting the fault signal 124 on diagnosis status pin 135, processor 18 may begin an interrogation input signal sequence. In the example of FIG. 2, processor 18 may send interrogation input signal 120 to channel four (CH4) of the multi-channel device. IN4_INT may receive interrogation input signal 120 on one of the inputs to AND_4. Note that in the example of FIG. 2, as long as channel four has a fault, status logic module 100 may continue to receive fault signal 122. Also, FIG. 2 depicts interrogation input signal 120 as a short, positive pulse, which may be approximately a few microseconds (μs). Channel AND gate, AND_4 may combine interrogation input signal 120 and fault signal 122 and send to XOR_1. XOR_1 may pass the combined signal 126 from AND_4 to delay module 130, which may trigger delay module 130 to send a delay mask signal 128 to output AND gate 134. Delay module 130 may receive a short (approximately 3 μs) pulse but will output a delay mask output signal 132 to the diagnosis status pin 135 for a predetermined delay time. The predetermined delay time may block fault signal 124 for sufficient time such that processor 18 may (a) no longer detect the fault signal on diagnosis status pin 135 and (b) respond as needed to register channel 4 as a fault channel. In this way, the system may determine which channel of the multi-channel device is a fault channel using only a single diagnosis status pin, and no addition diagnosis input control pins.

As depicted by the example of FIG. 2, note that if any respective channel, other than the fault channel, receives an interrogation input signal, the channel AND gate for the respective channel (e.g. AND_2) will not pass the interrogation input signal to XOR_1, unless that channel also has a respective channel fault signal. Also, note that the multi-channel device may detect a fault in two or more channels at the same time. If OR_1 detects two or more channel fault signals, then OR_1 may combine each respective channel fault signal into combined fault signal 124. As described above, output AND gate 134 may send combined fault signal 124 to diagnosis status pin 135. For example, if both channel four and channel two have a fault, then both FAULT_CH4 and FAULT_CH2 may receive a channel fault signal. OR_1 may combined both channel fault signals into combined fault signal 124 and send to diagnosis status pin 135 through output AND gate 134.

As with the single fault channel, in response to detecting the combined fault signal on diagnosis status pin 135, processor 18 may begin an interrogation input signal sequence. Processor 18 may send the interrogation input signal to each respective channel, one channel at a time. When CH2 receives the interrogation input signal at IN2_INT, then AND_2 may pass the combined signal to XOR_1 because AND_2 may also be receiving a channel fault signal on FAULT_CH2. When XOR_1 receives the combined signal from AND_2, then XOR_1 may trigger the delay mask module to mask the fault signal on diagnosis status pin 135 for the delay time. In the same way, status logic module 100 may mask the fault signal for the delay time when CH4 receives interrogation input signal 124. In this way, processor 18 may determine that both CH2 and CH4 have a fault.

Figure 3:
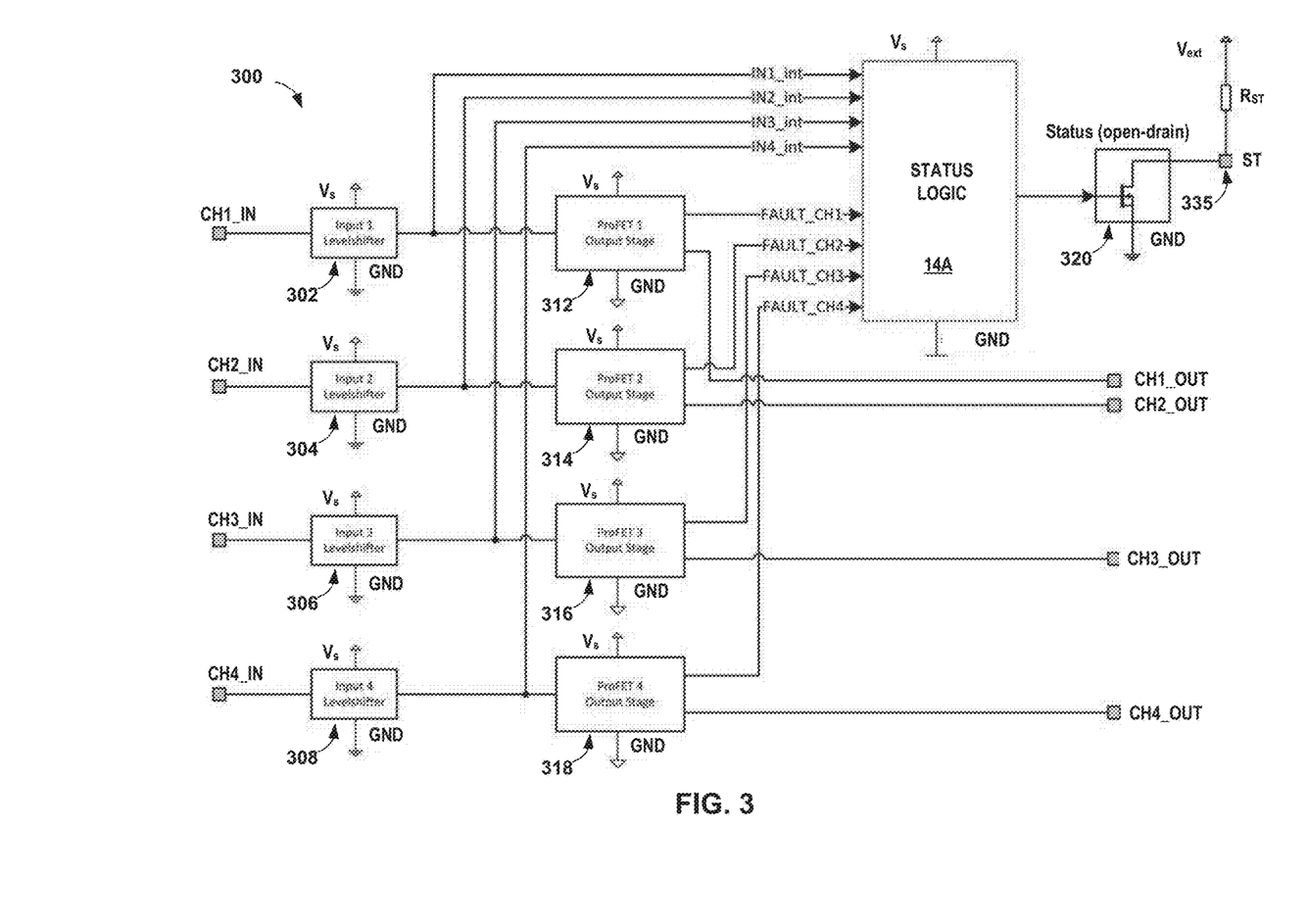
FIG. 3 is a conceptual an schematic block diagram illustrating further details of an example technique to implement a multi-channel device, in accordance with one or more techniques of this disclosure.

FIG. 3 is a conceptual an schematic block diagram illustrating further details of an example technique to implement a multi-channel device, in accordance with one or more techniques of this disclosure. FIG. 3 depicts multi-channel device 300 that may include a status logic module 14A and four channels, each channel with a respective input (IN1-IN4) and respective output (OUT1-OUT2). Input signals may enter input level shifters 302-308 and continue to both the respective output stages (312-318) and to IN1_INT-IN4_INT at status logic module 14A. Each respective output stage (312-318) may include a fault detection module that may connect to status logic module 14A with channel fault signals (FAULT_CH1-FAULT_CH4). As described above for FIGS. 1 and 2, status logic module 14A may output the combined fault signal on diagnosis status pin 335. In the example of FIG. 3, the combined fault signal may first pass through an open drain output stage 320 before reaching diagnosis status pin 335. In operation, the example of FIG. 3 functions as described above for FIGS. 1 and 2. The example graphs of FIG. 4A and FIG. 4B below will refer to FIG. 3.

Figure 4A:
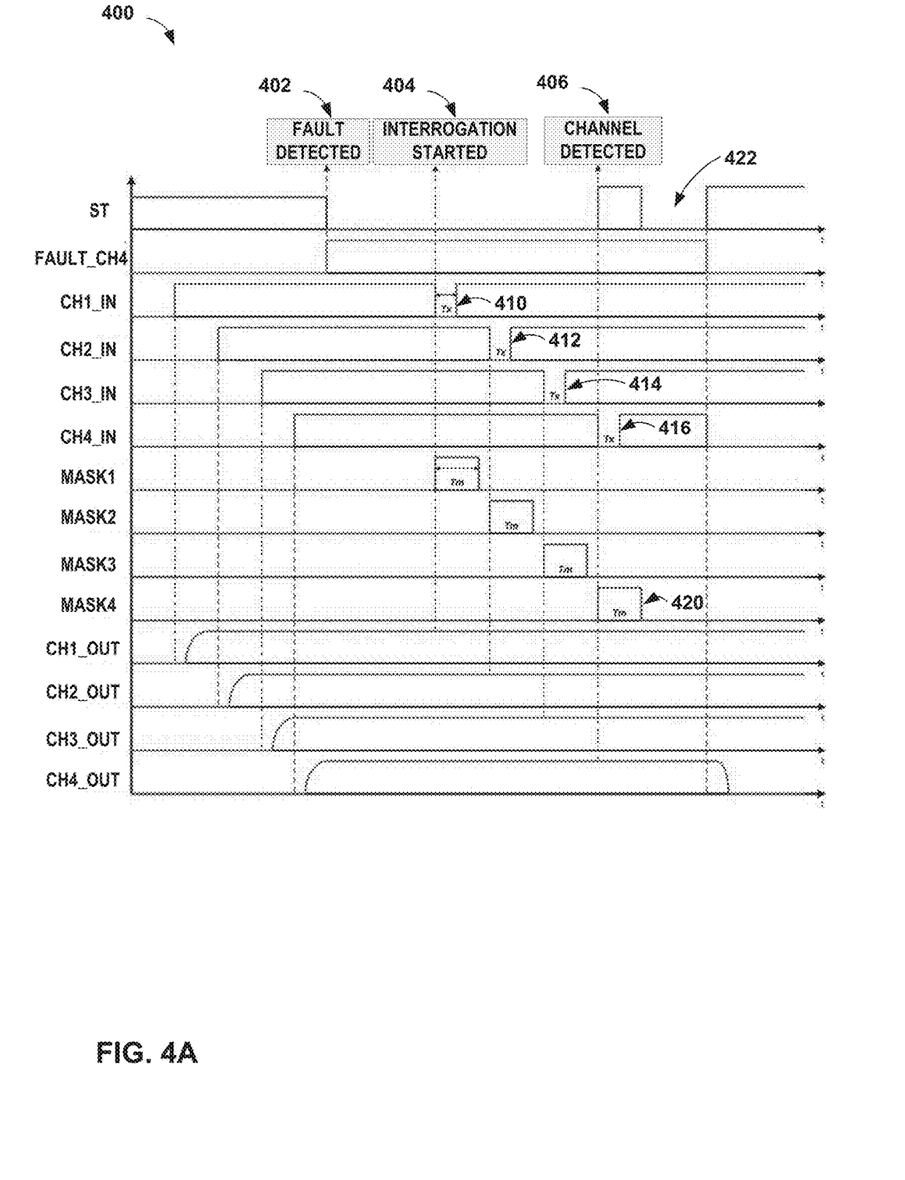
FIG. 4A is a timing diagram illustrating one or more techniques of this disclosure.

FIG. 4 is a timing diagram illustrating one or more techniques of this disclosure. At the top is the output of the diagnosis status pin (ST) in response to detecting a fault and receiving an interrogation input signal. The example of FIG. 4A depicts the diagnosis status pin ST as normally high. In response to detecting a fault (402) on channel four, the fault detection circuit in the channel four output stage 318 (shown in FIG. 3) may send a channel fault signal to the FAULT_CH4 input of status logic module 14A. Status logic module 14A may output the combined fault signal on the status pin ST, depicted as dropping from HIGH to LOW in FIG. 4A (402).

In response to detecting the fault signal on diagnosis status pin ST, processor 18 (shown in FIG. 1), may begin an interrogation input signal sequence (404). In the example of FIG. 4A, processor 18 may send the interrogation input signal input sequence to the input pin of one channel at a time beginning with CH1_IN. FIG. 4A depicts the interrogation input signal as a momentary interruption or deactivation 410 of the normal input signal. Because in this example, CH1 is not the fault channel, diagnosis status pin ST shows no change for interrogation input signal 410. Also note that the output signal for channel one, CH1_OUT, shows no change because of the momentary interruption during interrogation input signal 410.

Processor 18 may continue the interrogation input sequence by sending an interrogation input signal 412 to CH2_IN, followed by an interrogation input signal 414 to CH3_IN. Because neither CH2 nor CH3 are fault channels, interrogation input signals 412 and 414 have no effect on the fault signal at diagnostic status pin ST. Also note that the interrogation input signals had no impact on the outputs (CH2_OUT and CH3_out). The example of FIG. 4B discusses the impact of the interrogation input signal on the output signal in more detail.

Processor 18 may transmit an interrogation input signal to CH4_IN (416). Because CH4 is the fault channel in this example, status logic module 14A may receive the respective interrogation input signal at IN4_INT and trigger delay module 130 (shown in FIG. 2). Delay module 130 may output a delay mask signal 420 to mask the fault signal for a delay time. Note that the example of FIG. 4A depicts the delay time shown by 420 on graph MASK4 as longer in duration than the interrogation input signal 416. Delay module 130 may take the interrogation input signal that may be approximately a few microseconds, and output a delay mask signal 420 of a predetermined length. Note that neither the interrogation input signal on CH4_IN, nor the delay mask signal 420 has any impact on the output signal at CH4_OUT. As delay mask signal 420 ends, the fault signal at diagnostic status pin ST resumes (422). The sequence depicted by FIG. 4A is applicable to any number of channels. FIG. 4A illustrates a four-channel device. With additional channels, the interrogation input signal sequence may continue on CH5_IN, CH6_IN, CH7_IN and so on (not shown).

Figure 4B:
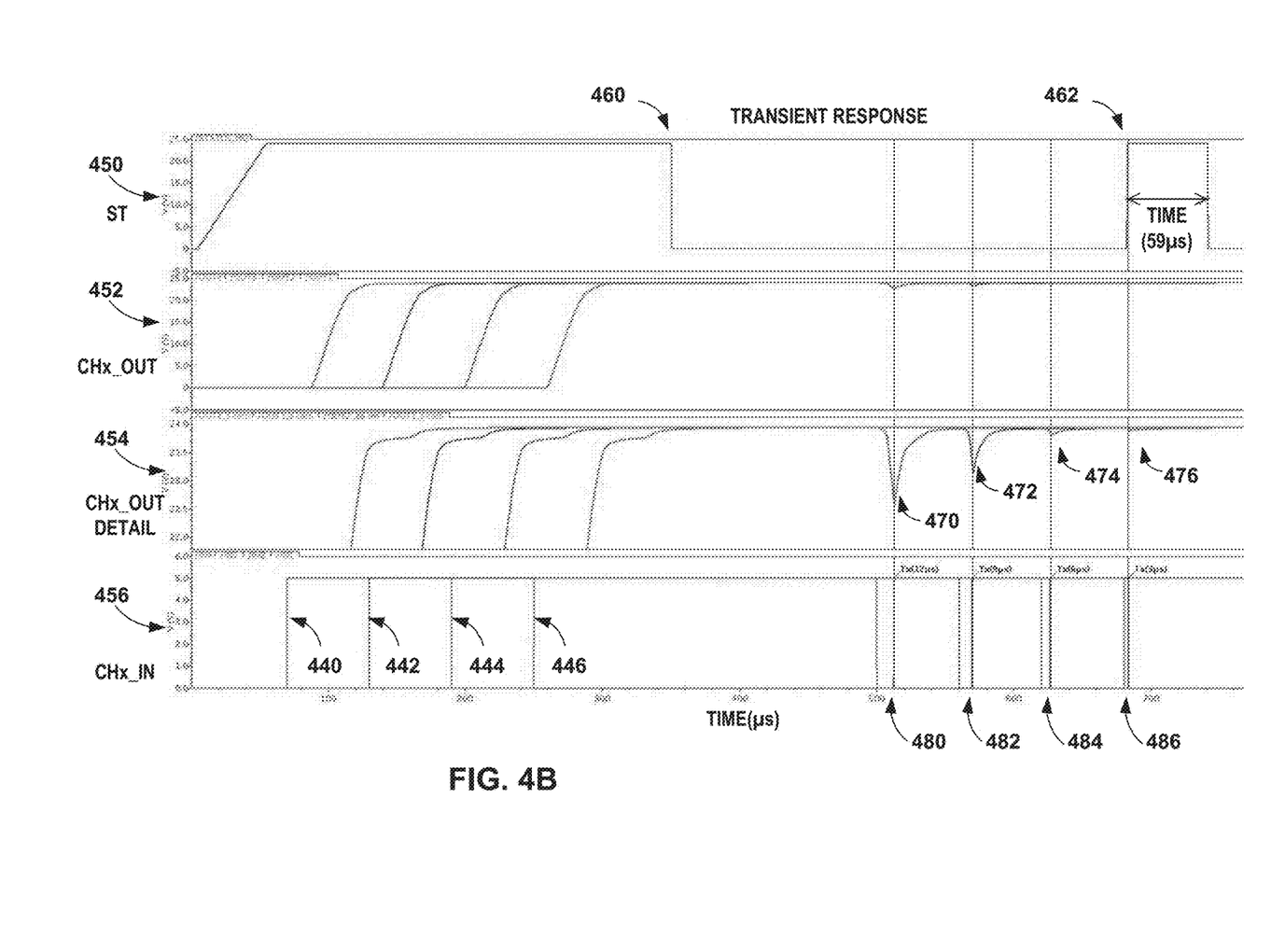
FIG. 4B is a timing diagram illustrating details of the interrogation input signal, in accordance with one or more techniques of this disclosure.

FIG. 4B is a timing diagram illustrating details of the interrogation input signal, in accordance with one or more techniques of this disclosure. The example of FIG. 4B shows the impact on the output from various interrogation input signals. The graph in the example of FIG. 4B includes a depiction of the fault signal, ST (450), the four output signals at the four output pins, CHx_OUT (452), a detailed, zoomed-in view of the four output signals, CHx_OUT (454) and the four input signals on the four channel input pins, CHx_IN (456). The FIG. 4B description refers to the four-channel example multi-channel device 300 of FIG. 3. Table 1 below summarizes the results of the example of FIG. 4B. As with the examples above, in this example channel four is the fault channel.

TABLE 1

| | Transient Response | | |
|---|---|---|---|
| Channel (456) | Interrogation input signal pulse width | Effect on output signal | Notes |
| CH1_IN (440) | 12 μs (480) | Significant (470) | |
| CH2_IN (442) | 9 μs (482) | Significant (472) | |
| CH3_IN (444) | 6 μs (484) | Minor (474) | |
| CH4_IN (446) | 3 μs (486) | Minimal (476) | Triggers delay mask |

In this example, multi-channel device 300 turns on and initially detects no fault, shown in 450 by the fault signal on the diagnosis status pin ST is HIGH. Device 300 may receive input signals on input pins, as shown in graph 456 as each input signal turns on (440-446). The corresponding output signals for each channel also turn on, as shown by graphs 452 and 454. The output signals may be measured at the output pin associated with each respective channel. Multi-channel device 300 may detect a fault, as shown by 460 on graph 450. In this example, multi-channel device 300 may indicate a fault by sending a LOW on diagnosis status pin ST, (335 as shown in FIG. 3). In this way, multi-channel device 300 may indicate to the system that multi-channel device 300 may have detected a fault. However, the system cannot yet determine which channel, or channels, have the fault yet.

The fault signal at diagnosis status pin ST may trigger processor 18 (shown in FIG. 1) to begin an interrogation input sequence, shown by 480-486 in graph 456. In this example processor 18 may send an interrogation input signal to CH1_IN that is a 12 μs interruption in the input signal to CH1_IN (480). This interrogation input signal has a significant impact (470) on the associated output signal at CH1_OUT. A significant impact on the output signal may also impact the operation of the system, such as system 10 (shown in FIG. 1) and therefore may not be desirable.

In the next example interrogation input signal, processor 18 interrupts the input signal to CH2_IN for 9 μs (482), which may also have a significant impact on the output signal CH2_OUT (472). In some examples, the multi-channel device output stages 312-318 (from FIG. 3) may include a power transistor with a relatively high gate capacitance. The relatively high gate capacitance of the power transistor may intrinsically mask a propagation of the interrogation input signal to the output signal, depending on the duration of the interrogation input signal. For the example interrogation input signal to CH3_IN (484), processor 18 interrupts the input signal to CH3_IN for 6 μs, causing only a minor impact to the output signal at the associated output pin CH3_OUT (474). This may still have an impact on example system 10 operation that may not be desirable.

For the interrogation input signal to CH4_in, processor 18 may interrupt the input signal for 3 μs (486). This duration has minimal impact on the output signal at CH4_OUT (476). Because CH4 is the fault channel, the interrogation input signal on CH4_IN may trigger the delay module to mask the fault signal on the diagnosis status pin, ST for a delay time (462). The 3 μs (486) interrogation input signal, when combined with high gate capacitance of the power transistor in output stages 312-318, may intrinsically mask a propagation of the interrogation input signal to the output signal. In other examples, output stages 312-318 may include an additional delay element placed before the power transistor in the output stage (not shown in FIG. 3). The additional delay element may mask the transmission of the interrogation input signal to the power transistor during the short interrogation pulse. The additional delay element may make the output stage completely blind to the diagnosis interrogation process, and may provide an advantage transmitting no influence of the interrogation input signal on the output signal.

The example of FIG. 4B depicts the delay time as 59 µs (462). In this way, the example of FIG. 4B depicts a 3 µs interrogation input signal duration that may have little to no impact on the output signal for the respective channel, yet is able to trigger the delay mask. Triggering the delay mask may allow enough time for processor 18 to (a) determine which channel is the fault channel and (b) be available to monitor the results of the next interrogation input signal. For example, the delay mask time for the fault channel may end before processor 18 may send the interrogation input signal for the next channel. Also note that processor 18 may send an interrogation input signal for only one channel at a time. In this way, the diagnosis interface may have low complexity, and may require no channel diagnosis address pins or multiplexing connections, which may be an advantage for some systems.

Figure 5:
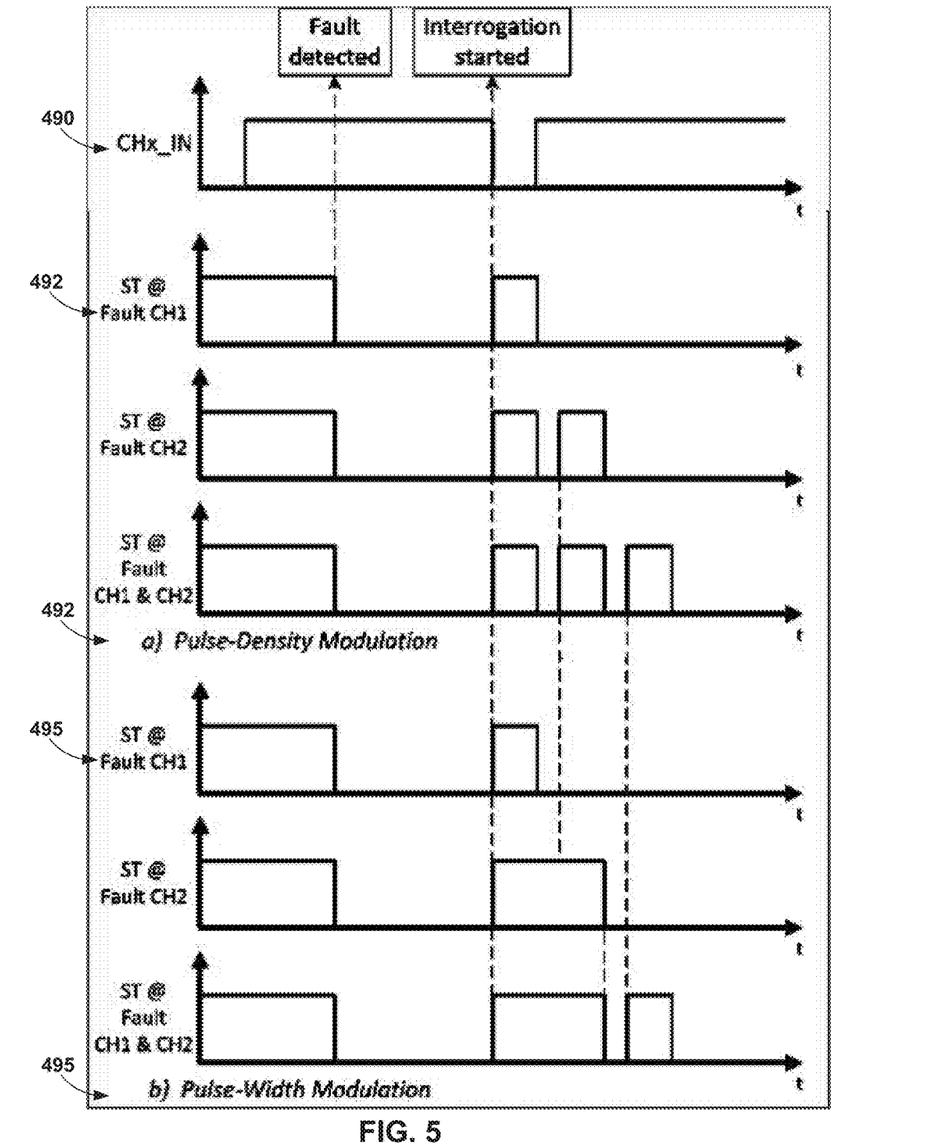
FIG. 5 is a timing diagram illustrating example techniques to implement line coding via a single diagnosis status pin to transfer diagnosis status to a decoding device.

FIG. 5 is a timing diagram illustrating example techniques to implement line coding via a single diagnosis status pin to transfer diagnosis status to a decoding device. FIG. 5 illustrates an example of line coding for a two-channel device featuring a pulse count 492, and an example featuring pulse width modulation (PWM) 495. Pulse count example 492 depicts three cases. The first illustrates a fault on channel one only 492A, the second on channel two only 492B and the third on both channels one and two 492C. Similarly, PWM example 495 first illustrates a fault on channel one only 495A, the second on channel two only 495B and the third on both channels one and two 495C. Though FIG. 5 describes a two-channel device, the techniques below apply to any multi-channel device as described in this disclosure.

A line coding feature may allow a multi-channel device, such as multi-channel device 12 from FIG. 1, to transmit a digital representation of the diagnostic status to a decoding device, such as processor 18 through the single diagnosis status pin ST. In the pulse count example of 492, a processor may monitor the status pin of a two-channel device, and determine the device has a fault. As described above, the processor may begin an interrogation input signal on a channel, e.g. CH1 (490). In response to the interrogation input signal, the two-channel device may output a series of pulses. For example, if CH2 is the fault channel, the two-channel device may output two pulses (492B). If both CH1 and CH2 are fault channels, the two-channel device may output three pulses (492C). For a multi-channel device, the number of pulses may correspond to a channel number of the fault channel. The decoder, e.g. processor, may be configured to decode the number of pulses to determine which channel, or channels have detected a fault.

For the PWM example of 495, the two-channel device may output pulses of different pulse widths that may correspond to the channel number. The processor may be configured to decode the pulse width to determine which channel, or channels have detected a fault. In the example of FIG. 5, if CH1 is the fault channel, the two-channel device may output a pulse with a first width via the single diagnosis status pin (495A). In the example of 495C, the two-channel device may output a series of pulses with different pulse widths. The processor may decode the pulse sequence to determine the fault channels.

By using line coding the system may determine additional details of the status of a multi-channel device, with the simplified architecture of the single diagnosis status pin. An additional advantage of a line coding concept may include identifying the type of fault, such as over temperature, overcurrent, open load and similar faults.

Figure 6:
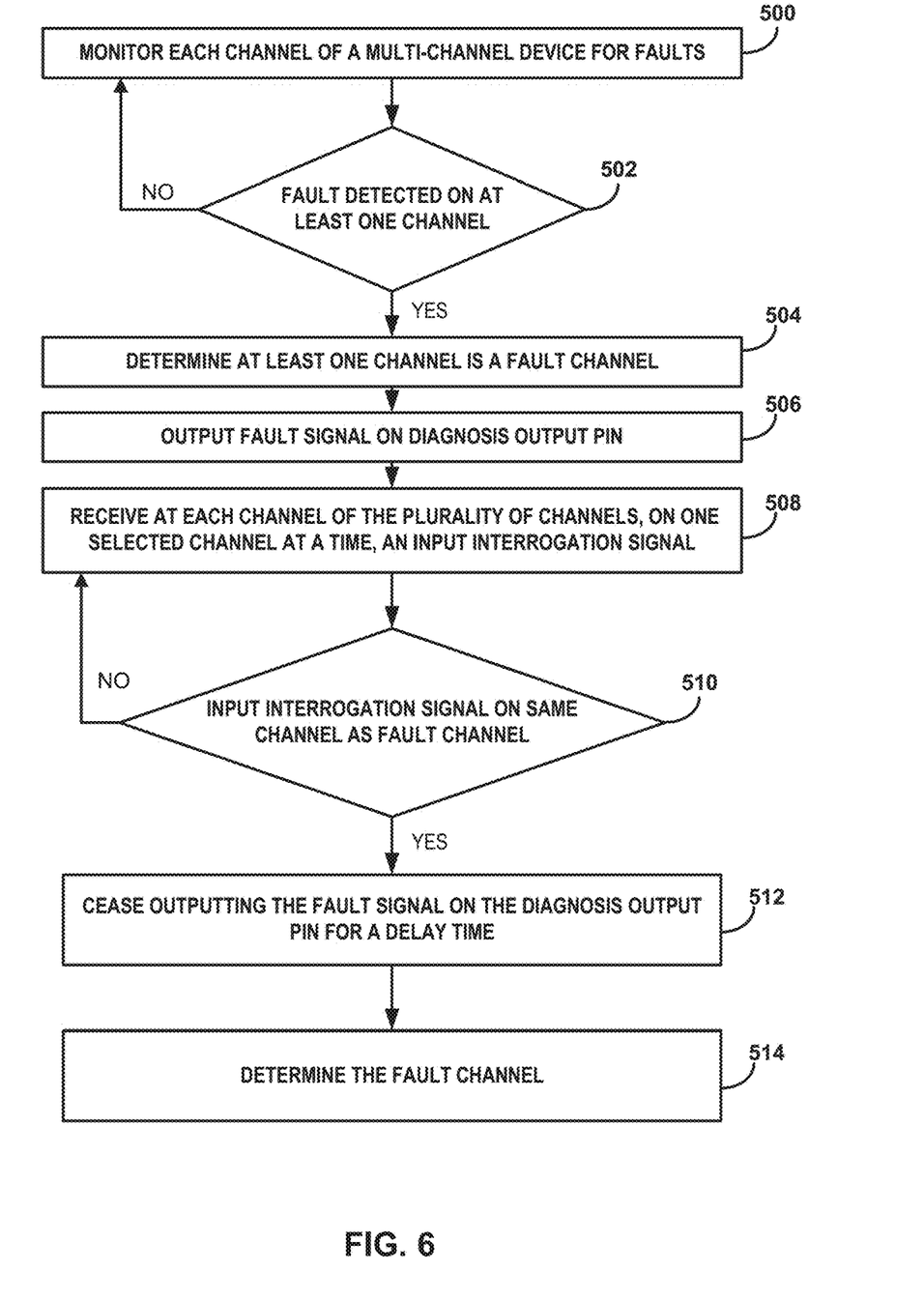
FIG. 6 is a flow chart illustrating one or more techniques of this disclosure.

FIG. 6 is a flow chart illustrating one or more techniques of this disclosure. The example of FIG. 6 considers system 10 from FIG. 1. The example of FIG. 1 depicts multi-channel device 12 as a four-channel device, but in other examples, multi-channel device 12 may have more than four or fewer than four channels.

As shown in FIG. 1, multi-channel device 12 may monitor each channel of all the channels in the multi-channel device (500). The example of FIG. 1 depicts fault detection module 16 as a separate module. In other examples, multi-channel device 12 may use other fault detection techniques, such as the output stage for each respective channel may manage fault detection, as shown in FIG. 3. While the fault detection module detects no fault (502), multi-channel device 12 may continue to monitor each channel (500).

In response to the multi-channel device detecting a fault on at least one channel (502), the device may determine the at least one channel is a fault channel (504). A multi-channel device that can communicate which channel is the fault channel to a system controller may have advantages for that system. In the example of FIG. 1, the multi-channel device has only the diagnosis status pin, ST, to communicate to processor 18 of system 10. For the example of FIG. 1, multi-channel device 12 may determine that CH4 has fault 20 but has not yet communicated to processor 18 which channel has the fault.

Multi-channel device 12 may output a fault signal on diagnosis status pin ST when multi-channel device 12 detects a fault (506). At this point, processor 18 may only determine that there is a fault somewhere on multi-channel device 12, but not yet which channel. In response to detecting the fault signal on diagnosis status pin 12, processor 18 may start an interrogation input signal sequence (508). In one example, the interrogation input signal may include processor 18 briefly deactivating the input signal to one or more channel input pins of multi-channel device 12. In the example of FIGS. 4A and 4B, multi-channel device 12 may receive the interrogation input signal on one channel at a time, beginning with channel one (CH1) and continuing in sequence to channel four (CH4) (508). In other examples, multi-channel device 12 may receive inputs in a different sequence, for example: CH2, CH4, CH1 and CH3. However, multi-channel device 12 may still receive only one interrogation input signal on one channel at a time (508). In other words, each respective channel may receive an input interrogation input signal at a time that is distinct from the time any other channel receives the interrogation input signal.

As with the example of FIGS. 1, 4A and 4B, multi-channel device 12 may receive an interrogation input signal on a channel that is not the same as the fault channel (510). In response, multi-channel device 12 may wait to receive the next interrogation input signal (508), but may continue to output the fault signal on the diagnosis status pin (506). However, at some time multi-channel device 12 may receive the interrogation input signal on the same channel as the fault channel (510).

In response, multi-channel device 12 may cease outputting the fault signal to the diagnosis status pin for a delay time (512). As discussed above in the example of FIG. 2, an interrogation input signal on the same channel as the fault channel may trigger delay module 130 to output a delay mask signal to the diagnosis status pin. The delay mask signal may cause multi-channel device 12 to pause the fault signal for a delay time that is sufficient for processor 18 to determine the input channel is the fault channel. For example, as shown in FIG. 4B, the 3 μs input interrogation signal 486 on CH4_IN may trigger a delay mask signal to cause multi-channel device 12 to cease output of the fault signal for the predetermined delay time 462. The example of FIG. 4B depicts the delay time as approximately 59 μs, but this is just an example for illustration. Any delay time sufficient for the system to determine the fault channel (514) and be ready for the next interrogation input signal may be adequate.

In response to detecting a fault in two or more channels of the multi-channel device, the example of FIG. 6 may repeat 508, 510, 512, and 514 more than once for a single interrogation input signal sequence. For example, the multi-channel device may detect a fault in both CH 2 and CH3 (502). In response, the multi-channel device may internally generate two channel fault signals, one channel fault signal for each respective fault channel (504). As shown above in the example of FIG. 2, multi-channel device 12 may combine each respective channel fault signal into a combined fault signal, using status logic module 100. Multi-channel device 12 may send the combined fault signal to the diagnosis status pin ST using OR_1 and output AND gate 134, shown in FIG. 2 above (506). For example, OR_1 may combine the channel fault signal for CH2 and CH3 into combined fault signal 124 and output the combined fault signal on diagnostic status pin ST (135 in FIG. 2) (506).

In response to the respective interrogation input signal on the same channel as the respective fault channel (510), such as CH2, multi-channel device 12 may cease outputting the fault signal on diagnosis status pin ST for the delay time (512). In this way processor 18 may determine that CH2 is a fault channel. Multi-channel device 12 may next receive an interrogation input signal on CH3_IN (508). Because CH3 is also a fault channel (510), multi-channel device 12 may cease outputting the fault signal for the delay time (512). In this way processor 18 may determine that both CH2 and CH3 the fault channels (514).

EXAMPLE 1

A system comprising a multi-channel device including: a diagnosis status pin; a plurality of channels; a plurality of input pins, wherein each channel of the plurality of channels has an associated input pin; a plurality of output pins, wherein each channel of the plurality of channels has an associated output pin; and a processor coupled to the diagnosis status pin and configured to determine which channel of the plurality of channels is a fault channel using the diagnosis status pin.

EXAMPLE 2

The system of example 1 further comprising the processor coupled to at least each respective input pin of the plurality of input pins, the processor configured to monitor the diagnosis status pin of the multi-channel device; detect a fault signal on the diagnosis status pin; in response to a fault signal on the diagnosis status pin: transmit, for each input pin of the plurality of input pins, a respective interrogation input signal on each respective input pin; determine, for a respective interrogation input signal on a respective input pin, whether the processor is continuing to detect the fault signal on the diagnosis status pin; in response to the processor continuing to detect the fault signal on the diagnosis status pin for the respective interrogation input signal on the respective input pin, determine the respective channel is not a fault channel; and in response to the processor detecting no fault signal on the diagnosis status pin for the respective interrogation input pulse on the respective input pin, determine the respective channel is a fault channel.

EXAMPLE 3

The system of any combination of examples 1-2, wherein the interrogation input signal on an input pin does not affect a respective output signal of a channel associated with the input pin.

EXAMPLE 4

The system of any combination of examples 1-2, wherein the processor is further configured to transmit the interrogation input signal on each input pin, wherein the processor transmits the interrogation input signal to one and only one input pin at a time.

EXAMPLE 5

The system of any combination of examples 1-4, wherein the multi-channel device comprises a status logic module configured to: monitor the status of the plurality of channels of the multi-channel device; receive a channel fault signal for a channel that is a fault channel; send the fault signal to the diagnosis status pin; receive an interrogation input signal on a respective channel of the plurality of channels; and in response the interrogation input signal being on the same channel as the fault channel, trigger a delay module to output a delay mask signal to the diagnosis status pin, wherein the delay mask signal causes the diagnosis status pin to cease the output of the fault signal on the diagnosis status pin for a delay time.

EXAMPLE 6

The system any combination of of examples 1-5, wherein the status logic module, in response to a fault in two or more channels of the multi-channel device, is further configured to: combine each respective channel fault signal into a combined fault signal; send the combined fault signal to the diagnosis status pin; and in response the respective interrogation input signal being on the same channel as the respective fault channel, trigger the delay module to output a respective delay mask signal to the diagnosis status pin for each respective fault channel for a delay time.

EXAMPLE 7

The system of any combination of examples 1-5, wherein the interrogation input signal is short compared to the delay time.

EXAMPLE 8

The system of any combination of examples 1-7, wherein the processor comprises one or more of: a microprocessor, a controller, a digital signal processor (DSP), an application specific integrated circuit (ASIC), a field-programmable gate array (FPGA), a system on chip (SoC), and integrated processing circuitry.

EXAMPLE 9

The system of any combination of examples 1-8, wherein the multi-channel device comprises a six-channel device.

EXAMPLE 10

A multi-channel device comprising: a diagnosis status pin; a plurality of channels; a plurality of input pins, wherein each channel of the plurality of channels has an associated input pin; a plurality of output pins, wherein each channel of the plurality of channels has an associated output pin; and the multi-channel device configured to: detect a fault on at least one channel of the plurality of channels; and output which channel is a fault channel using the diagnosis status pin.

EXAMPLE 11

A multi-channel device of claim 10, wherein the multi-channel device is further configured to: in response to detecting the fault on the at least one channel, output a fault signal on the diagnosis status pin; receive, for each channel of the plurality of channels, a respective interrogation input signal on each respective channel; determine, for each respective channel, whether the respective channel that received the interrogation input signal the fault channel; in response to determining the channel that received the interrogation input signal is not the fault channel, continuing to output the fault signal on the diagnosis status pin; in response to determining the channel that received the interrogation input signal is the fault channel, cease output of the fault signal on the diagnosis status pin.

EXAMPLE 12

The multi-channel device of any combination of examples 10-11, wherein the interrogation input signal on a respective channel does not affect an output signal at the output pin associated with the channel.

EXAMPLE 13

The multi-channel device of any combination of examples 10-12, further comprising a status logic module including a delay module, the status logic module configured to: monitor the status of the plurality of channels of the multi-channel device; receive a channel fault signal for the fault channel; send the fault signal to the diagnosis status pin; receive, for each channel of the plurality of channels, the respective interrogation input signal on each respective channel; and in response the interrogation input signal being on the same channel as the fault channel, trigger the delay module to output a delay mask signal to the diagnosis status pin, wherein the delay mask signal causes the diagnosis status pin to cease the output of the fault signal on the diagnosis status pin for a delay time.

EXAMPLE 14

The multi-channel device of any combination of examples 10-12 and 13, wherein the status logic module, in response to a fault in two or more channels of the multi-channel device, is further configured to: combine each respective channel fault signal into a combined fault signal; send the combined fault signal to the diagnosis status pin; and in response the respective interrogation input signal being on the same channel as the respective fault channel, trigger the delay module to output a respective delay mask signal to the diagnosis status pin for each respective fault channel for a delay time.

EXAMPLE 15

The multi-channel device of any combination of examples 10-14, wherein the multi-channel device comprises a six-channel device.

EXAMPLE 16

A method comprising: monitoring, by a multi-channel device, each channel of a plurality of channels in the multi-channel device; detecting, by the multi-channel device, a fault in at least one channel of the multi-channel device; and in response to detecting a fault on the at least one channel: determining at least one channel is a fault channel; and outputting which channel is the fault channel using the diagnosis status pin.

EXAMPLE 17

The method of example 16, further comprising: outputting a fault signal on a diagnosis status pin of the multi-channel device; receiving, at each respective channel of the plurality of channels, a respective input interrogation signal, wherein each respective channel is receiving the respective input signal at a time distinct from the time any other channel is receiving the respective input signal; in response to receiving the respective input interrogation signal on the respective channel that is not the fault channel, continue outputting the fault signal on the diagnosis status pin; in response to receiving the respective input interrogation signal on the respective channel that is the fault channel, cease outputting the fault signal on the diagnosis status pin for a delay time.

EXAMPLE 18

The method of any combination of examples 16-17, wherein the interrogation input signal on a respective channel does not affect an output signal associated with the channel.

EXAMPLE 19

The method of any combination of examples 16-17, in response to receiving the respective input interrogation signal on the respective channel that is the fault channel, further comprising triggering a delay module to output a delay mask signal to the diagnosis status pin, wherein the delay mask signal causes the diagnosis status pin to cease outputting the fault signal on the diagnosis status pin for the delay time.

EXAMPLE 20

The method of any combination of examples 16-19, wherein in response to detecting, by the multi-channel device, a fault in two or more channels of the multi-channel device: generating, by the multi-channel device, a channel fault signal for each respective channel that is a fault channel; combining, by the multi-channel device, each respective channel fault signal into a combined fault signal; sending the combined fault signal to the diagnosis status pin;

and in response the respective interrogation input signal being on the same channel as the respective fault channel, outputting a respective delay mask signal to the diagnosis status pin for each respective fault channel for a delay time.

Various embodiments of the disclosure have been described. These and other embodiments are within the scope of the following claims.

The invention claimed is:

1. A system comprising:
   a multi-channel device including:
   a diagnosis status pin, wherein the multi-channel device is configured to output a fault signal on the diagnosis status pin;
   a plurality of channels;
   a plurality of input pins, wherein each channel of the plurality of channels has an associated input pin;
   a plurality of output pins, wherein each channel of the plurality of channels has an associated output pin; and
   a processor, separate from the multi-channel device, coupled to the diagnosis status pin and configured to determine which channel of the plurality of channels is a fault channel based on the fault signal from the diagnosis status pin.

2. The system of claim 1 further comprising the processor coupled to at least each respective input pin of the plurality of input pins, the processor configured to:
   monitor the diagnosis status pin of the multi-channel device;
   detect a fault signal on the diagnosis status pin;
   in response to a fault signal on the diagnosis status pin:
   transmit, for each input pin of the plurality of input pins, a respective interrogation input signal on each respective input pin;
   determine, for a respective interrogation input signal on a respective input pin, whether the processor is continuing to detect the fault signal on the diagnosis status pin;
   in response to the processor continuing to detect the fault signal on the diagnosis status pin for the respective interrogation input signal on the respective input pin, determine the respective channel is not a fault channel; and
   in response to the processor detecting no fault signal on the diagnosis status pin for the respective interrogation input pulse on the respective input pin, determine the respective channel is a fault channel.

3. The system of claim 2, wherein the interrogation input signal on an input pin does not affect a respective output signal of a channel associated with the input pin.

4. The system of claim 2, wherein the processor is further configured to transmit the interrogation input signal on each input pin, wherein the processor transmits the interrogation input signal to one and only one input pin at a time.

5. The system of claim 1, wherein the multi-channel device comprises a status logic module configured to:
   monitor the status of the plurality of channels of the multi-channel device;
   receive a channel fault signal for a channel that is a fault channel;
   send the fault signal to the diagnosis status pin;
   receive an interrogation input signal on a respective channel of the plurality of channels; and
   in response to the interrogation input signal being on the same channel as the fault channel, trigger a delay module to output a delay mask signal to the diagnosis status pin, wherein the delay mask signal causes the diagnosis status pin to cease the output of the fault signal on the diagnosis status pin for a delay time.

6. The system of claim 5, wherein the status logic module, in response to a fault in two or more channels of the multi-channel device, is further configured to:
   combine each respective channel fault signal into a combined fault signal;
   send the combined fault signal to the diagnosis status pin; and
   in response the respective interrogation input signal being on the same channel as the respective fault channel, trigger the delay module to output a respective delay mask signal to the diagnosis status pin for each respective fault channel for a delay time.

7. The system of claim 5, wherein the interrogation input signal is short compared to the delay time.

8. The system of claim 1, wherein the processor comprises one or more of: a microprocessor, a controller, a digital signal processor (DSP), an application specific integrated circuit (ASIC), a field-programmable gate array (FPGA), a system on chip (SoC), and integrated processing circuitry.

9. The system of claim 1, wherein the multi-channel device comprises a six-channel device.

10. A multi-channel device comprising:
    a diagnosis status pin;
    a plurality of channels;
    a plurality of input pins, wherein each channel of the plurality of channels has an associated input pin;
    a plurality of output pins, wherein each channel of the plurality of channels has an associated output pin; and
    wherein the multi-channel device is configured to:
    detect a fault on at least one channel of the plurality of channels;
    in response to detecting the fault on the at least one channel, output a fault signal on the diagnosis status pin to processing circuitry, wherein the processing circuitry is separate from the multi-channel device; and
    indicate to the processing circuitry which channel of the plurality of channels is the fault channel based on the fault signal output from the diagnosis status pin.

11. A multi-channel device of claim 10, wherein the multi-channel device is further configured to:
    receive, for each channel of the plurality of channels, a respective interrogation input signal on each respective channel;
    determine, for each respective channel, whether the respective channel that received the interrogation input signal is the fault channel;
    in response to determining the channel that received the interrogation input signal is not the fault channel, continuing to output the fault signal on the diagnosis status pin;
    in response to determining the channel that received the interrogation input signal is the fault channel, cease output of the fault signal on the diagnosis status pin.

12. The multi-channel device of claim 11, wherein the interrogation input signal on a respective channel does not affect an output signal at the output pin associated with the channel.

13. The multi-channel device of claim 11, further comprising a status logic module including a delay module, the status logic module configured to:
    monitor the status of the plurality of channels of the multi-channel device;
    receive a channel fault signal for the fault channel;
    send the fault signal to the diagnosis status pin;

receive, for each channel of the plurality of channels, the respective interrogation input signal on each respective channel; and in response the interrogation input signal being on the same channel as the fault channel, trigger the delay module to output a delay mask signal to the diagnosis status pin, wherein the delay mask signal causes the diagnosis status pin to cease the output of the fault signal on the diagnosis status pin for a delay time.

14. The multi-channel device of claim 13, wherein the status logic module, in response to a fault in two or more channels of the multi-channel device, is further configured to:

combine each respective channel fault signal into a combined fault signal;

send the combined fault signal to the diagnosis status pin; and in response the respective interrogation input signal being on the same channel as the respective fault channel, trigger the delay module to output a respective delay mask signal to the diagnosis status pin for each respective fault channel for a delay time.

15. The multi-channel device of claim 10, wherein the multi-channel device comprises a six-channel device.

16. A method comprising:

monitoring, by a multi-channel device, each channel of a plurality of channels in the multi-channel device;

detecting, by the multi-channel device, a fault in at least one channel of the multi-channel device; and in response to detecting a fault on the at least one channel:

determining at least one channel is a fault channel;

in response to detecting the fault on the at least one channel, outputting a fault signal on a diagnosis status pin to processing circuitry, wherein the processing circuitry is separate from the multi-channel device; and indicating to the processing circuitry which channel of the plurality of channels is the fault channel based on the fault signal output from the diagnosis status pin.

17. The method of claim 16, further comprising:

receiving, at each respective channel of the plurality of channels, a respective input interrogation signal, wherein each respective channel is receiving the respective input interrogation signal at a time distinct from the time any other channel is receiving the respective input interrogation signal;

in response to receiving the respective input interrogation signal on the respective channel that is not the fault channel, continue outputting the fault signal on the diagnosis status pin;

in response to receiving the respective input interrogation signal on the respective channel that is the fault channel, cease outputting the fault signal on the diagnosis status pin for a delay time.

18. The method of claim 17, wherein the input interrogation signal on a respective channel does not affect an output signal associated with the channel.

19. The method of claim 17, in response to receiving the respective input interrogation signal on the respective channel that is the fault channel, further comprising triggering a delay module to output a delay mask signal to the diagnosis status pin, wherein the delay mask signal causes the diagnosis status pin to cease outputting the fault signal on the diagnosis status pin for the delay time.

20. The method of claim 17, wherein in response to detecting, by the multi-channel device, a fault in two or more channels of the multi-channel device:

generating, by the multi-channel device, a channel fault signal for each respective channel that is a fault channel;

combining, by the multi-channel device, each respective channel fault signal into a combined fault signal;

sending the combined fault signal to the diagnosis status pin; and in response to the respective input interrogation signal being on the same channel as the respective fault channel, outputting a respective delay mask signal to the diagnosis status pin for each respective fault channel for a delay time.

* * * * *